United States Patent [19]

Dworkin et al.

[11] Patent Number: 5,600,581

[45] Date of Patent: Feb. 4, 1997

[54] LOGARITHM/INVERSE-LOGARITHM CONVERTER UTILIZING LINEAR INTERPOLATION AND METHOD OF USING SAME

[75] Inventors: James D. Dworkin, Chandler, Ariz.; Philip B. Giangarra, Mansfield, Mass.; Stephen L. Smith, Chandler, Ariz.

[73] Assignee: Motorola, Inc., Schaumburg, Ill.

[21] Appl. No.: 391,880

[22] Filed: Feb. 22, 1995

[51] Int. Cl.$^6$ ................................ G06F 1/02; G06F 7/00; G06F 15/00

[52] U.S. Cl. .................... 364/722; 364/748.5; 341/75; 395/800

[58] Field of Search ................................ 364/722, 748, 364/748.5, 715.03, 736; 341/75

[56] References Cited

U.S. PATENT DOCUMENTS

| | | | |
|---|---|---|---|
| 4,555,768 | 11/1985 | Lewis, Jr. et al. | 364/757 |
| 4,922,212 | 5/1990 | Roberts et al. | 331/176 |
| 5,301,138 | 4/1994 | Lindsley | 364/748.5 |
| 5,331,582 | 7/1994 | Sudo et al. | 364/722 |
| 5,343,254 | 8/1994 | Wada et al. | 348/627 |

FOREIGN PATENT DOCUMENTS

WO93/17383  9/1993  WIPO ........................... G06F 7/52

OTHER PUBLICATIONS

Computation of the Base Two Logarithm of Binary Numbers by M. Combet et al., IEEE Transactions on Electronic Computers, vol. EC 14, No. 6, Dec. 1963.

A Logarithmic Vector Processor for Neural Net Applications by Steve Richfield, Neurosoft, IEEE First International Conference on Neural Networks, Sheraton Harbor Island East, San Diego, California, Jun. 21–24, 1987.

A Multiplier–Less Digital Neural Network by L. Spaaneburg, B. Hoefflinger, S. Neusser, J. A. G. Nijhuis, A. Siggelkow, IMS, Stuttgart, Germany, Proceedings of the 2nd Int'l Conference on Microelectronics for Neural Networks, Oct. 16–18, 1991, Munich, F. R. Germany.

Algorithm Design for a 30 bit Integrated Logarithmic Processor by David M. Lewis and Lawrence K. Yu, Department of Electrical Engineering, University of Toronto, Proceeding 9th Symposium on Computer Arithmetic, 1989, IEEE Comp. Soc. Press, pp. 192–199.

An Architecture for Addition and Subtraction of Long Word Length Numbers in the Logarithmic Number System by David M. Lewis, Member, IEEE, IEEE Transactions on Computers, vol. 39, No. 11. Nov. 1990, pp. 1325–1336.

A 30–b Integrated Logarithmic Number System Processor by Lawrence K. Yu, Member, IEEE, and David M. Lewis, Member, IEEE, IEEE Journal of Solid–State Circuits, vol. 26, No. 10, Oct. 1991, pp. 1433–1440.

An Accurate LNS Arithmetic Unit Using Interleaved Memory Function Interpolator by David M. Lewis, Department of Electrical Engineering, University of Toronto, Proceeding 11th Symposium on Computer Arithmetic, 1993, IEEE Comp. Soc. Press, pp. 2–9.

Interleaved Memory Function Interpolators with Application to an Accurate LNS Arithmetic Unit by David M. Lewis, Member, IEEE, IEEE Transactions on Computers, vol. 43, No. 8, Aug. 1994, pp. 974–982.

(List continued on next page.)

Primary Examiner—Roy N. Envall, Jr.
Assistant Examiner—Emmanuel L. Moise
Attorney, Agent, or Firm—Michael K. Lindsey

[57] ABSTRACT

A converter which may be used for implementing either logarithmic or inverse-logarithmic functions includes a memory, a multiplier, and an adder. The memory stores a plurality of pre-computed values which are used in an interpolation to estimate a logarithmic or inverse-logarithmic function over a domain of input signals.

26 Claims, 3 Drawing Sheets

OTHER PUBLICATIONS

Table–Lookup Algorithms for Elementary Functions and Their Error Analysis by Ping Tak Peter Tang, Matematics and Computer Schience Division, Argonne National Laboratory, 9700 S. Cass Ave., Argonne, IL 60439–4801, Proceeding 10th Symposium on Computer Arithmetic, Jun. 1991, pp. 232–236.

Applying Features of IEEE 754 to Sign/Logarithm Arithmetic by Mark G. Arnold, Member, IEEE, Thomas A. Bailey, Member, IEEE, John R. Cowles, and Mark D. Winkel, IEEE Transactions on Computers, vol. 41, No. 8, Aug. 1992, pp. 1040–1050.

D8.13 Improved Accuracy for Logarithmic Addition in DSP Applications by Mark G. Arnold, John Cowles, and Thomas Bailey, Computer Science Department, University of Wyoming, Laramie, WY, ICASSP 88: Int. Conf. on Acoustics, Speech and Signal Processing, vol. 3 pp. 1714–1717.

Redundant Logarithmic Number Systems by M. G. Arnold, T. A. Bailey, J. R. Cowles, J. J. Cupal, University of Wyoming, Laramie, WY, Proceeding of 9th Symposium on Computer Arithmetic, pp. 144–151, IEEE Comp. Soc. Press.

Comments on "An Architecture for Addition and Subtraction of Long Word Length Numbers in the Logarithmic Number System"[1] by M. Arnold, T. Bailey and J. Cowles, IEEE Transactions on Computers, vol. 41, No. 6, Jun. 1992, pp. 786–788.

Redundant Logarithmic Arithmetic, Mark G. Arnold, Member IEEE, Thomas A. Bailey, Member IEEE, John R. Cowles, and Jerry J. Cupal, Members IEEE, IEEE Transactions on Computers, vol. 39, No. 8, Aug. 1990, pp. 1077–1086.

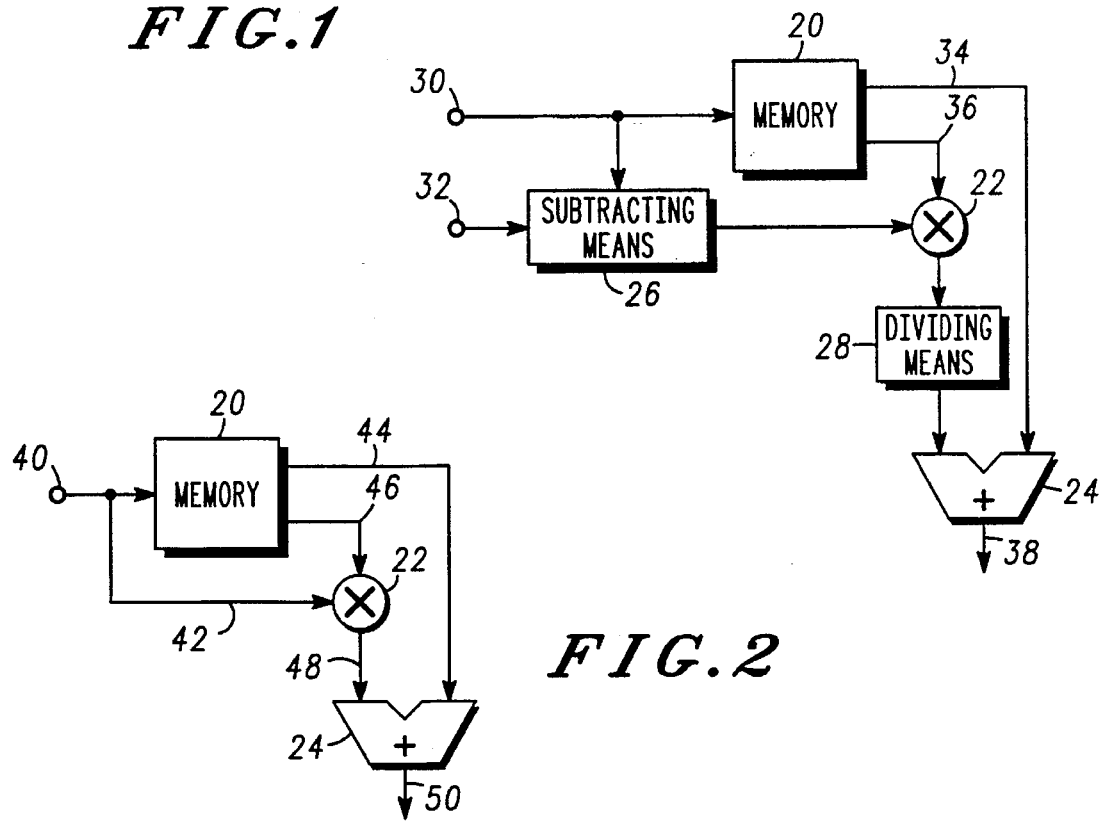
FIG.1
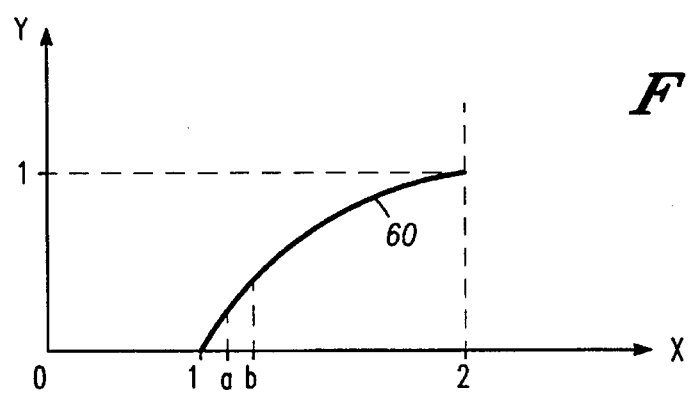
FIG.2
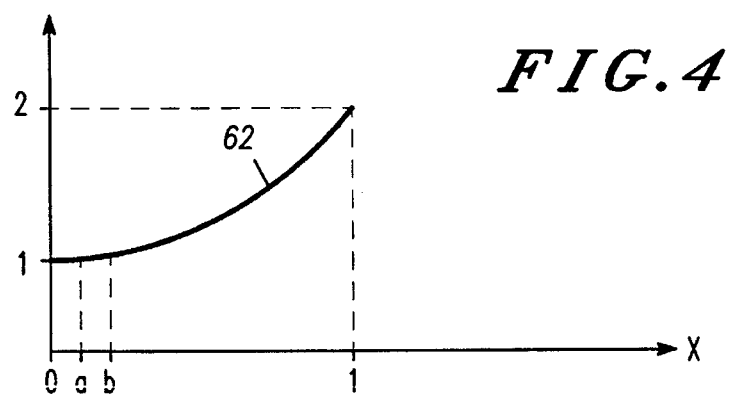
FIG.3
FIG.4

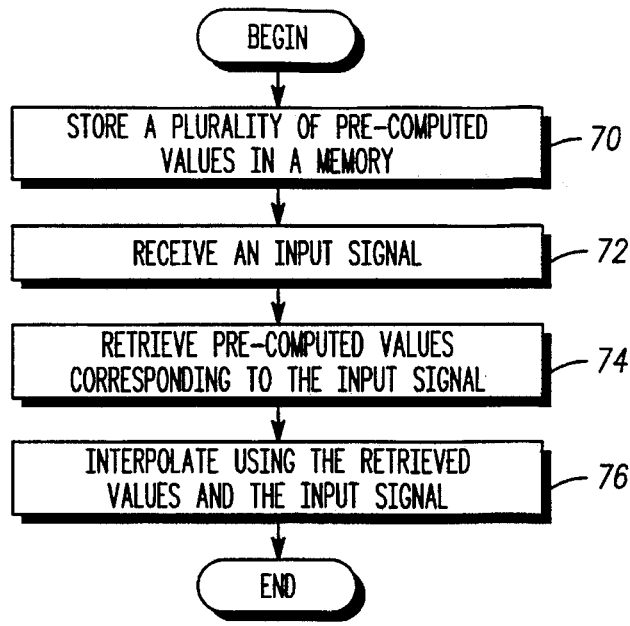
FIG.5
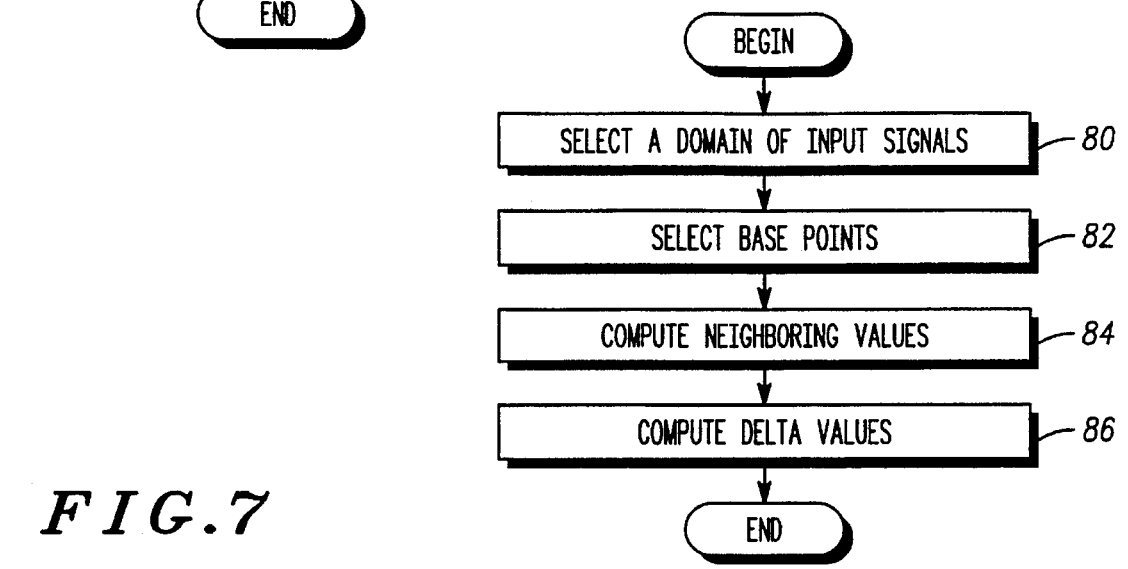
FIG.6
FIG.7
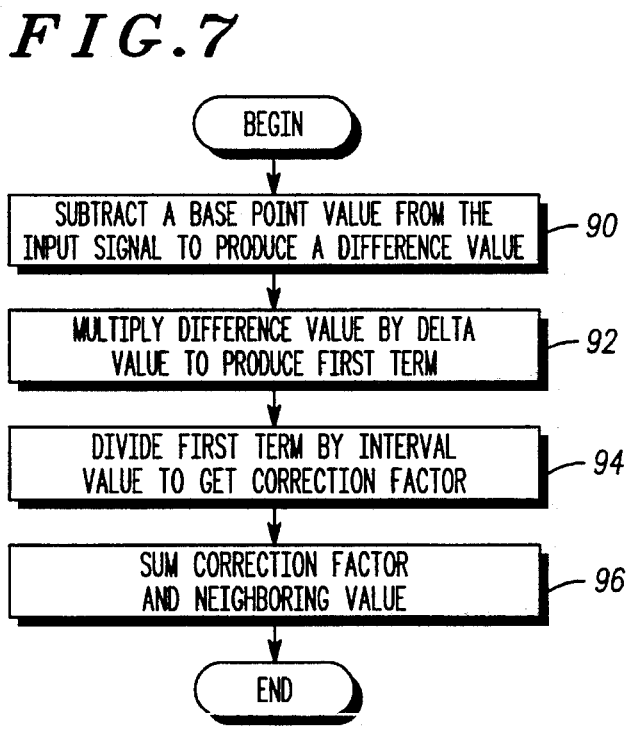

5,600,581

LOGARITHM/INVERSE-LOGARITHM CONVERTER UTILIZING LINEAR INTERPOLATION AND METHOD OF USING SAME

RELATED INVENTIONS

The present invention is related to the following inventions which are assigned to the same assignee as the present invention:

(1) "Logarithm/Inverse-Logarithm Converter and Method of Using Same", having Ser. No. 08/381,368, filed on Jan. 31, 1995.

(2) "Logarithm/Inverse-Logarithm Converter Utilizing a Second-order Term and Method of Using Same", having Ser. No. 08/382,467, filed on Jan. 31, 1995.

(3) "Logarithm/Inverse-Logarithm Converter Utilizing a Truncated Taylor Series and Method of Use Thereof", having Ser. No. 08/381,167, filed on Jan. 31, 1995.

(4) "Neural Network Utilizing a Logarithmic Function and Method of Using Same", having Ser. No. 08/176,601 filed on Dec. 31, 1993.

(5) "Computer Processor Utilizing Logarithmic Conversion and Method of Use Thereof", having Ser. No. 08/403,158, filed on Mar. 13, 1995.

The subject matter of The above-identified related inventions is hereby incorporated by reference into the disclosure of this invention.

TECHNICAL FIELD

The present invention relates generally to computing circuits and, in particular, to a computing circuit which may be used to perform either a logarithmic or inverse-logarithmic conversion on an input value.

BACKGROUND OF THE INVENTION

Logarithmic converters are devices used to implement logarithmic functions and are most commonly found in items such as hand-held calculators and spread sheet software programs. Logarithmic functions, or log functions, belong to a class of mathematical functions called transcendental functions which are important in wide variety of applications such as data communications, control systems, chemical processes, and computer simulation. A log function is abbreviated with the following mathematical equation $y=\log_b(x)$. In this equation, x represents an input value which may be any number greater than or equal to zero; b represents a base number system; and y represents a logarithm value, or log value, which corresponds to the input value x.

Inverse-log converters are devices used to implement inverse-logarithmic, or inverse-log, functions. Essentially, an inverse-log function is the reverse of a log function. What is meant by "reverse" is explained in the following discussion. A log function converts an input value, x, which is in a domain of input values into a definite log value which is in a range of log values. Basically, the log function establishes a one-to-one correspondence between input values in the domain and log values in the range. This correspondence is represented symbolically by x→y. An inverse-log function establishes a reverse correspondence between log values and input values which is represented by y→x. An inverse-log function is abbreviated with either of the following equivalent mathematical equations: $y=\log_b^{-1}(x)$ or $y=b^x$. In these equations, x represents an input value; b represents a base number system; and y represents an inverse-log value which corresponds to the input value x and may be any number greater than or equal to zero. Like log functions, inverse-log functions are important in a wide variety of applications.

Two techniques of computing log and inverse-log values are commonly used today. Both techniques are analogously used to compute either log or inverse-log values; thus, for the sake of brevity, the following discussion will focus on using the techniques to compute log values, with the understanding that the techniques may be used in a like manner to compute inverse-log values.

The first technique involves storing a corresponding log value in a look-up table for every possible input value to a converter. This approach allows a log value to be computed relatively quickly and is practical for applications requiring limited precision and having input values within a small domain. However, in many applications this technique is impractical because it requires too great a memory space to store the look-up table. For example, in a digital system using an IEEE standard 32-bit floating point number, which has a 23-bit mantissa, such a look-up table would be required to store up to $2^{23}$ log values—one for every possible mantissa value. A computer memory for storing this number of log values would be prohibitively expensive, if not impossible, to build.

The second technique of computing log values involves computing a power series to approximate a log function. An example of a power series which approximates a log function is given as:

$$y=Log(1+x)=x-x^2/2+x^3/3-x^4/4' \qquad \text{Equation 1}$$

In this example, Equation 1 approximates a specific type of log function known as a natural logarithm, which is widely used in science and engineering applications. The variables in Equation 1 are defined as follows: y represents a log value, and x represents an input value in the domain $-1 \leq x < 1$. Although the technique of using a power series to approximate a log function allows a log value to be computed with a high degree of precision, it requires a large number of computer operations and therefore requires a relatively long period of time to execute. In other words, this technique is generally slow and negatively affects the throughput of a computer.

In summary, there is a need for a converter which can perform either a log or an inverse-log function quickly, thus allowing a computer to operate with greater throughput. Such a converter should also reduce the amount of memory space required to perform the conversions, and it should produce log or inverse-log values which have a high degree of precision.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 1 illustrates a logarithm/inverse-logarithm converter in accordance with one embodiment of the present invention.

FIG. 2 illustrates a logarithm/inverse-logarithm converter in accordance with a preferred embodiment of the present invention.

FIG. 3 shows a graph of a logarithmic function.

FIG. 4 shows a graph of an inverse-logarithmic function.

FIG. 5 illustrates a flow chart diagram of a method of using the logarithm/inverse-logarithm converter shown in FIG. 1, FIG. 6 illustrates a flow chart diagram of a method of computing pre-computed values used by the logarithm/inverse-logarithm converter shown in FIG. 1.

FIG. 7 illustrates a flow chart diagram of a method of interpolating used by the logarithm/inverse-logarithm converter shown in FIG. 1.

DETAILED DESCRIPTION OF A PREFERRED EMBODIMENT

Figure 8:
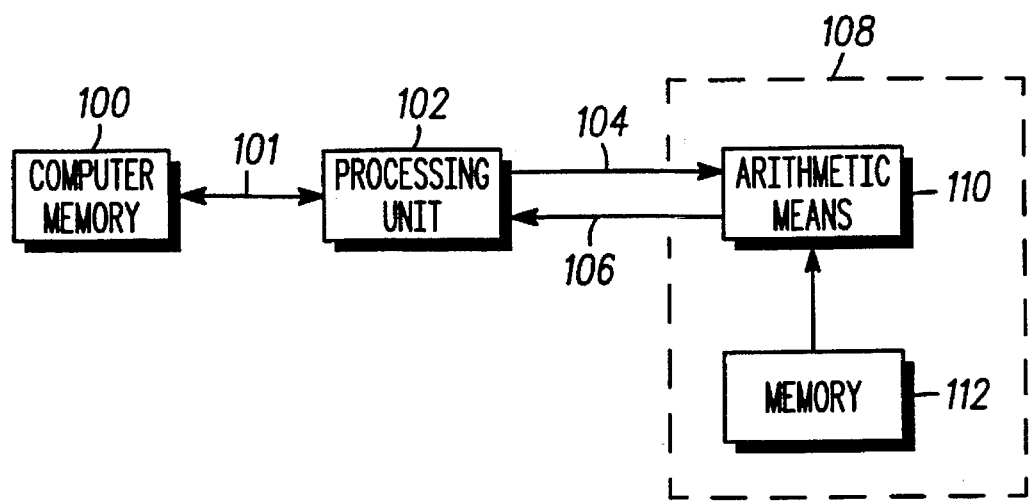
FIG. 8 illustrates one version of a computing device which incorporates an embodiment of the present invention.

It is an advantage of the present invention to provide a converter which can be used to perform either a logarithmic or inverse-logarithmic conversion without altering the design of the converter. A further advantage of the present invention is that it provides a converter in a computer, processor, controller or similar device, which computes log and inverse-log signals with a high degree of precision. Yet another advantage of the present invention is that it provides a converter which requires a significantly reduced amount of memory space and may be efficiently implemented in an integrated circuit which consumes little power. An additional advantage of the present invention is to provide a method of using the converter to produce either log or inverse-log signals.

Generally, the present invention provides a converter for computing either a log or an inverse-log function. The converter comprises a memory and an arithmetic means. The memory stores a plurality of pre-computed values. The arithmetic means, which generates a log or an inverse-log signal, depending on the values stored in the memory, performs arithmetic operations which implement an interpolation involving an input signal and ones of the stored values.

The converter may be re-configured by loading the memory with a different set of pre-computed values. In fact, the converter may be easily re-configured to approximate any continuous function on the input signal, including log and inverse-log functions, as well as transcendental functions such as sine, cosine, and tangent functions, or functions having a different base number system or domain of input signals. Although the converter of the present invention may be applied to a number of different functions, only the calculation of log or inverse-log functions will be discussed herein.

FIG. 1 illustrates a logarithm/inverse-logarithm converter in accordance with one embodiment of the present invention. The converter comprises a memory 20, a multiplier 22, an adder 24, a subtracting means 26, and a dividing means 28. The memory 20 stores the plurality of pre-computed values which include a plurality of delta values and a plurality of neighboring values.

Rather than store every unique log (or inverse-log) value for every possible input signal, the memory 20 stores only a fraction of the possible log (or inverse-log) values. When an exact log (or inverse-log) value of an input signal is not found in the memory 20, the log (or inverse-log) value is approximated by linear interpolation between two neighboring values which are stored in the memory 20.

A neighboring value is defined as a binary number which represents a log (or inverse-log) value for a specific value of the input signal. Neighboring values are pre-computed at selected values of the input signal. These selected values are referred to as base points. A delta value is a binary number which represents the difference between two adjacent neighboring log (or inverse-log) values. Like neighboring values, delta values are also pre-computed.

The converter implements a linear interpolation given by the equation:

$$y = n + d^*(x-b)/i \qquad (1)$$

where y represents an output value which could be either a log or an inverse-log signal; n represents the neighboring value; d represents the delta value; x represents the input signal; b represents the base point value nearest, but not greater than the input signal; and i represents an interval value. The interval value is the difference between two adjacent base points.

The converter operates as follows. The input signal 30 provides an address which is used to retrieve a corresponding delta value 36 and neighboring value 34. The values retrieved correspond to the base point which is nearest, but not greater than the value of the input signal 30. The subtracting means 26 subtracts the base point value 32 from the input signal 30 to produce a difference value. The multiplier 22 multiplies the difference value by the delta value 36 to produce a first term. The dividing means 28 divides the first term by the interval value to produce a correction factor. The adder 24 sums the correction factor and the neighboring value 34 to produce the output value 38 which includes either the log or inverse-log signal.

FIG. 2 illustrates a logarithm/inverse-logarithm converter in accordance with a preferred embodiment of the present invention. In a preferred embodiment, the input signal 40 is a binary value having a length of 16 bits, denoted by [15:0], wherein the most significant nine bits, [15:7], of the input signal 40 are provided to the memory 20 as an address. Additionally, the delta and neighboring values corresponding to the input signal 40 are located in the memory 20 at a common address. The delta value 46 is a 9-bit binary value and the neighboring value 44 is a 17-bit binary value. A 17-bit binary value is used for the neighboring value 44 in order to produce a 16-bit log or inverse-log signal that has less than ±½ LSB (least significant bit) error. A total of 512 delta values and 512 neighboring values are stored in the memory 20.

The multiplier 22 multiplies a bit slice 42 of the input signal 40 by the delta value 46 to produce the correction factor 48. The bit slice 42 includes the seven least significant bits [6:0] of the input signal 40. The adder 24 sums the correction factor 48 and the neighboring value 44 to produce the output value 50. The correction factor 48 is a 17-bit value which includes eight zero bits concatenated with the nine most significant bits of the output of the multiplier 22. Essentially, the dividing means 28 is replaced by padding the nine most significant bits of the multiplier output with zeros to produce the correction factor. The adder 24 generates a 17-bit output value 50. The least significant bit of the output value 50 is truncated to produce the 16-bit log or inverse-log signal.

In one embodiment of the present invention, the converter is implemented with a custom integrated circuit. However, one of ordinary skill will recognize that a programmable logic array, application specific integrated circuit (ASIC), or other digital logic device, as well as software running on a processor such as a microprocessor could also be used to implement the converter.

FIG. 3 shows a graph of a logarithmic function 60 over a domain of input signals. The log function 60 uses a base number system of two. The input signals are given along the x-axis and the log signals are given along the y-axis. The domain of the input signals is 1 to 2, and the range of the log signals is 0 to 1. An interval within the domain is bounded by a pair of base points. An example interval is indicated with vertical dotted lines at base points a and b. Each interval contains data points between adjacent base points. Each base point in the domain corresponds to a location in the memory which contains pre-computed values for the interval.

FIG. 4 shows a graph of an inverse-logarithmic function 52 over a domain of input signals. The input signals are given along the x-axis and the inverse-log signals are given along the y-axis. The domain of the input signals is 0 to 1, and the range of the inverse-log signals is 1 to 2. An interval within the range is bounded by a pair of base points. An example interval is indicated with vertical dotted lines at base points a and b. Each interval contains data points between adjacent base points. Each base point in the domain corresponds to a location in the memory which contains pre-computed values for the interval. The inverse-log function 62 also uses a base two number system.

One of ordinary skill in the art will realize that the converter of the present invention may be used for computing any log or inverse-log function; however, in a preferred embodiment of the present invention, the converter computes the log function depicted in FIG. 3 and the inverse-log function depicted in FIG. 4.

A 23-bit floating point number may be easily converted to a log or an inverse-log signal using the converters shown in FIGS. 1 and 2. A 23-bit floating point value has one sign bit, a 16-bit mantissa, and a 6-bit exponent. Referring now to FIG. 2, only the mantissa is provided to the converter as the input signal 40. Both the sign bit and exponent bypass the converter and are later combined with the output value 50. Essentially, the converter computes either $y=\log_2(1.M$ or $y=\log_2^{-1}(0.F)$, where y represents the output value 50, M represents the mantissa, and F is a binary number which represents a fractional number between 0 and 1. The exponent of the floating point number is a base-two value, $2^e$, where e represents the exponent. A log or an inverse-log signal corresponding to the floating point input is generated by summing of the output value 50 and the exponent, following conversion of the mantissa. This summation results in a value represented in a binary number format which includes a j-bit fractional portion and a k-bit integer portion. The number of bins in each portion may vary, depending on the desired precision of the converter.

FIG. 5 illustrates a flow chart diagram of a method of using the logarithm/inverse-logarithm converter shown in FIG. 2. The method may be used for generating either a log signal or an inverse-log signal. In box 70, the pre-computed values are stored in the memory 20. Pre-computed values corresponding to a single input signal may be stored at the same address in the memory 20. In box 72, an input signal 30 is received. Next, in box 74, pre-computed values which correspond to the input signal 30 are retrieved from the memory 20.

In box 76, an interpolation is performed using the retrieved values and the input signal 30 to produce the output value 38. The retrieved values include the neighboring value 34 and the delta value 36. Details of the interpolation are provided reference to FIG. 7.

FIG. 6 illustrates a flow chart diagram of a method of computing the pre-computed values used by the logarithm/inverse-logarithm converter shown in FIG. 1. The method may be used for computing pre-computed values for either a log or an inverse-log function. Referring now to box 80, a domain of input signals is selected for the function. Next, in box 82, the domain is partitioned into a plurality of intervals which are bounded by base points. The base points are predetermined input signals. In order to simplify the division operation performed by the converter, the intervals are of equal length. In box 84, the neighboring values are computed. A neighboring value is simply the log or inverse-log signal of a base point. In box 86, the delta values are computed. A delta value is the difference between log signals (or inverse-log signals) of adjacent base points.

In a preferred embodiment of the present invention, the domain of input signals is partitioned with 512 base points into 512 intervals, each containing 128 data points.

FIG. 7 illustrates a flow chart diagram of a method of interpolating used by the logarithm/inverse-logarithm converter shown in FIG. 1. In box 90, the base point value is subtracted from the input signal to produce a difference value. In box 92, the difference value is multiplied by the delta value to produce a first term. Next, in box 94, the first term is divided by an interval value to produce a correction factor. The interval value is the difference between adjacent base point values. In a preferred embodiment of the invention, the interval value is constant, as the base points are equally spaced. In box 96, the correct, ion factor and the neighboring value are summed to produce the output value.

FIG. 8 illustrates one version of a computing device which incorporates an embodiment of the present invention. The computing device comprises a processing unit 102 for executing a computer operation which utilizes a log/inverse-log signal 106; a computer memory 100 for storing a computer program which includes the computer operation; a bus 101 connecting the processing unit 102 and the computer memory 100; and a converter 108 which receives an input signal 104.

The converter 108 may include the converter shown in FIG. 1. In the example shown, the converter 108 includes a memory 112 and an arithmetic means 110 which is operatively coupled to the memory 112. The arithmetic means receives the input signal 104 from the processing unit 102 and, in turn, generates either a log signal or an inverse-log signal depending on the parameters stored in the memory 112.

Figure 9:
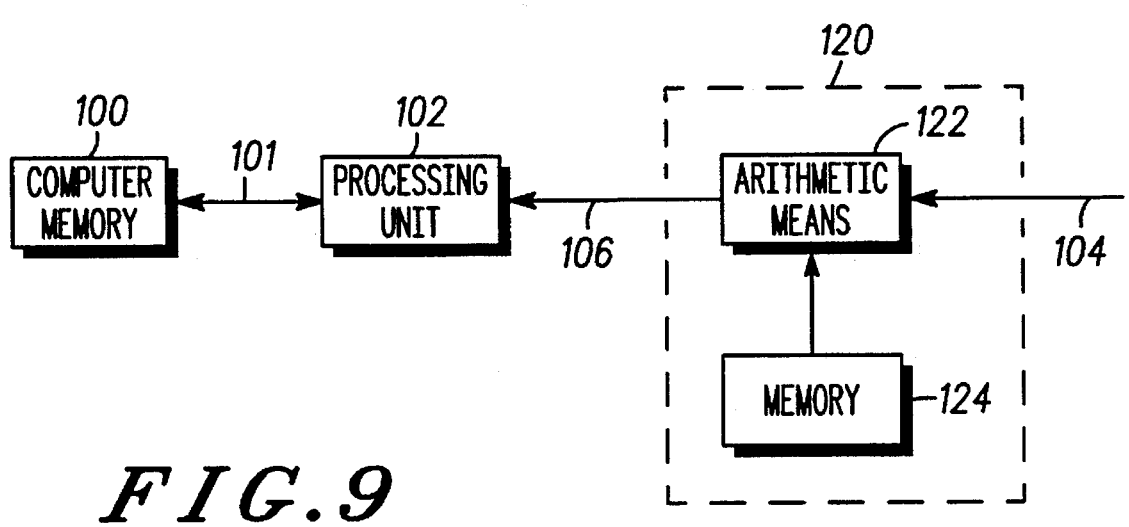
FIG. 9 illustrates another version of a computing device which incorporates an embodiment of the present invention.

FIG. 9 illustrates another version of a computing device which incorporates an embodiment of the present invention. The computing device comprises a processing unit 102 for executing a computer operation which utilizes a log/inverse-log signal 106; a computer memory 100 for storing a computer program which includes the computer operation; a bus 101 connecting the processing unit 102 and the computer memory 100; and a converter 120 which receives an input signal 104.

The converter 120 may include the converter shown in FIG. 1. In the example shown, the converter 120 includes a memory 124 and an arithmetic means 122 which is operatively coupled to the memory 124. The arithmetic means 122 receives the input signal 104 and, in turn, generates either a log signal or an inverse-log signal depending on the parameters stored in the memory 124.

Thus there has been described herein a concept, as well as a preferred embodiment, of a converter which may be used to compute either a log or an inverse-log function. Because the embodiment of the converter as herein-described utilizes linear interpolation to approximate a function it can perform either a log or an inverse-log conversion using single adder, a single multiplier, and a look-up table which allows a significant reduction in memory size. Such a converter allows both improved data throughput and computation precision with a vast reduction in the cost and complexity of implementation, whether on a semiconductor chip or in a computer program, While the various embodiments of the present invention have been described in terms of the processing of an input value into an output value, the present invention should be construed to include circuits and methods implemented by these circuits for processing an input signal representative of the input value into an output signal representative of the output value, While specific embodiments of the present invention have been shown and described, it will be apparent to those skilled in the art that the disclosed invention may be modified in numerous ways and may assume many embodiments other than the preferred form specifically set out and described above.

Accordingly, it is intended by the appended claims to cover all modifications of the invention which fall within the true spirit and scope of the invention,

What is claimed is:

1. A method for generating a log signal, which method comprises the following steps:

receiving a digital input signal having a first bit slice representing a plurality of most significant bits and a second bit slice representing a plurality of least significant bits;

retrieving from a memory a neighboring log value and a delta value corresponding to the first bit slice;

multiplying the second bit slice by the delta value to produce a term value;

generating a correction factor that represents the term value divided by an interval value; and summing the correction factor and the neighboring log value to produce the log signal.

2. The method of claim 1, further comprising the following steps:

selecting a domain of input signals;

selecting a plurality of base points within the domain;

computing a respective neighboring log value for each of the plurality of base points, whereby producing a plurality of neighboring log values;

computing a plurality of delta values, wherein each of the plurality of delta values is equal to the difference between neighboring log values of adjacent base points; and storing the plurality of neighboring log values and the plurality of delta values in the memory.

3. The method of claim 2, wherein the step of storing includes locating a neighboring log value and a delta value which correspond to a same input signal at a common address in the memory.

4. A logarithm converter, which comprises:

a memory for storing a plurality of neighboring log values and a plurality of delta values, the memory providing as output a neighboring log value and a delta value which correspond to a first bit slice of a digital input signal;

a multiplier for multiplying a second bit slice of the digital input signal by the delta value to produce a first term;

means for generating a correction factor that represents the first term divided by an interval value; and an adder for summing the correction factor and the neighboring log value to produce the log signal.

5. The logarithm converter of claim 4, wherein the generating means includes:

a data path connecting a most significant portion of the multiplier output to a least significant portion of an adder input, whereby providing at the adder input the correction factor representing the first term divided by a power of two.

6. The logarithm converter of claim 4, wherein the pluralities of neighboring log values and delta values are pre-computed for a plurality base point values within a pre-selected domain of input signals.

7. The logarithm converter of claim 6, wherein ones of the neighboring log values and delta values corresponding to a same base point are located at a common address in the memory.

8. A logarithm converter for generating a log signal in response to a digital input signal, the logarithm converter comprising:

a memory for storing a plurality of neighboring log values and a plurality of delta values, the memory providing as output a neighboring log value and a delta value which correspond to a first bit slice of the input signal;

a multiplier for multiplying a second bit slice of the input signal by the delta value to produce a correction factor representing a first term divided by an interval value; and an adder for summing the correction factor and the neighboring log value to produce the log signal.

9. The logarithm converter of claim 8, wherein the pluralities of neighboring log values and delta values are pre-computed for a plurality base point values within a pre-selected domain of input signals.

10. The logarithm converter of claim 9, wherein ones of the neighboring log values and delta values corresponding to a same base point are located at a common address in the memory.

11. A computing device, which comprises:

a processing unit for executing a computer operation which utilizes a log signal;

a computer memory for storing a computer program which includes the computer operation;

a bus for connecting the processing unit and the computer memory; and a logarithm converter which receives a digital input signal and includes:

a memory for storing a plurality of neighboring log values and a plurality of delta values, the memory providing as output a neighboring log value and a delta value which correspond to a first bit slice of the digital input signal;

a multiplier for multiplying a second bit slice of the digital input signal by the delta value to produce a correction factor representing a first term divided by an interval value; and an adder for summing the correction factor and the neighboring log value to produce the log signal.

12. The computing device of claim 11, wherein the pluralities of neighboring log values and delta values are pre-computed for a plurality base point values within a pre-selected domain of input signals.

13. The computing device of claim 12, wherein ones of the neighboring log values and delta values corresponding to a same base point are located at a common address in the memory.

14. A method for generating an inverse-log signal, which method comprises the following steps:

receiving a digital input signal having a first bit slice representing a plurality of most significant bits and a second bit slice representing a plurality of least significant bits;

retrieving from a memory a neighboring inverse-log value and a delta value corresponding to the first bit slice;

multiplying the second bit slice by the delta value to produce a term value;

generating a correction factor that represents the term value divided by an interval value; and summing the correction factor and the neighboring log value to produce the inverse-log signal.

15. The method of claim 14, further comprising the following steps:

selecting a domain of input signals;

selecting a plurality of base points within the domain;

computing a respective neighboring inverse-log value for each of the plurality of base points, whereby producing a plurality of neighboring inverse-log values;

computing a plurality of delta values, wherein each of the plurality of delta values is equal to the difference between neighboring inverse-log values of adjacent base points; and storing the plurality of neighboring inverse-log values and the plurality of delta values in the memory.

16. The method of claim 15, wherein the step of storing includes locating a neighboring inverse-log value and a delta value which correspond to a same input signal at a common address in the memory.

17. An inverse-logarithm converter, which comprises:

a memory for storing a plurality of neighboring inverse-log values and a plurality of delta values, the memory providing as output a neighboring inverse-log value and a delta value which correspond to a first bit slice of a digital input signal;

a multiplier for multiplying a second bit slice of the digital input signal by the delta value to produce a first term;

means for generating a correction factor that represents the first term divided by an interval value; and an adder for summing the correction factor and the neighboring inverse-log value to produce the inverse-log signal.

18. The inverse-logarithm converter of claim 17, wherein the generating means includes:

a data path connecting a most significant portion of the multiplier output to a least significant portion of an adder input, whereby providing at the adder input the correction factor representing the first term divided by a power of two.

19. The inverse-logarithm converter of claim 17, wherein the pluralities of neighboring inverse-log values and delta values are pre-computed for a plurality of base point values within a pre-selected domain of input signals.

20. The inverse-logarithm converter of claim 19, wherein ones of the neighboring log values and delta values corresponding to a same base point are located at a common address in the memory.

21. A inverse-logarithm converter for generating a inverse-log signal in response to a digital input signal, the inverse-logarithm converter comprising:

a memory for storing a plurality of neighboring inverse-log values and a plurality of delta values, the memory providing as output a neighboring inverse-log value and a delta value which correspond to a first bit slice of the input signal;

a multiplier for multiplying a second bit slice of the input signal by the delta value to produce a correction factor representing a first term divided by an interval value; and an adder for summing the correction factor and the neighboring inverse-log value to produce the inverse-log signal.

22. The inverse-logarithm converter of claim 21, wherein the pluralities of neighboring inverse-log values and delta values are pre-computed for a plurality of base point values within a pre-selected domain of input signals.

23. The inverse-logarithm converter of claim 22, wherein ones of the neighboring log values and delta values corresponding to a same base point are located at a common address in the memory.

24. A computing device, which comprises:

a processing unit for executing a computer operation which utilizes a inverse-log signal;

a computer memory for storing a computer program which includes the computer operation;

a bus for connecting the processing unit and the computer memory; and a inverse-logarithm converter which receives a digital input signal and includes:

a memory for storing a plurality of neighboring inverse-log values and a plurality of delta values, the memory providing as output a neighboring inverse-log value and a delta value which correspond to a first bit slice of the digital input signal;

a multiplier for multiplying a second bit slice of the digital input signal by the delta value to produce a correction factor representing a first term divided by an interval value; and an adder for summing the correction factor and the neighboring inverse-log value to produce the inverse-log signal.

25. The computing device of claim 24, wherein the pluralities of neighboring inverse-log values and delta values are pre-computed for a plurality of base point values within a pre-selected domain of input signals.

26. The computing device of claim 25, wherein ones of the neighboring log values and delta values corresponding to a same base point are located at a common address in the memory.

* * * * *